US010504860B2

(12) United States Patent
Kubo et al.

(10) Patent No.: US 10,504,860 B2
(45) Date of Patent: Dec. 10, 2019

(54) SEMICONDUCTOR DEVICE

(71) Applicant: THINE ELECTRONICS, INC., Tokyo (JP)

(72) Inventors: Shunichi Kubo, Tokyo (JP); Yoshinobu Oshima, Tokyo (JP); Masaki Mitarai, Tokyo (JP)

(73) Assignee: THINE ELECTRONICS, INC., Tokyo (JP)

( * ) Notice: Subject to any disclaimer, the term of this patent is extended or adjusted under 35 U.S.C. 154(b) by 13 days.

(21) Appl. No.: 15/319,931

(22) PCT Filed: Jun. 12, 2015

(86) PCT No.: PCT/JP2015/067055
§ 371 (c)(1),
(2) Date: Dec. 19, 2016

(87) PCT Pub. No.: WO2015/194482
PCT Pub. Date: Dec. 23, 2015

(65) Prior Publication Data
US 2017/0133331 A1 May 11, 2017

(30) Foreign Application Priority Data
Jun. 20, 2014 (JP) .................................. 2014-127418

(51) Int. Cl.
*H01L 23/495* (2006.01)
*H01L 23/60* (2006.01)
(Continued)

(52) U.S. Cl.
CPC ............ *H01L 23/60* (2013.01); *H01L 21/822* (2013.01); *H01L 23/3114* (2013.01);
(Continued)

(58) Field of Classification Search
CPC ......... H01L 23/49503; H01L 23/49838; H01L 23/19861; H01L 23/60; H01L 23/49575; H01L 23/49861
See application file for complete search history.

(56) References Cited

U.S. PATENT DOCUMENTS 5,061,979 A * 10/1991 Kobayashi ........ H01L 27/14665
136/244
5,068,603 A * 11/1991 Mahoney ........... G01R 31/2853
257/E23.151
(Continued)

FOREIGN PATENT DOCUMENTS

CN 1254187 A 5/2000
CN 101258597 A 9/2008
(Continued)

OTHER PUBLICATIONS

Communication dated Dec. 12, 2017 from the Japanese Patent Office in counterpart application No. 2014-127418.
(Continued)

*Primary Examiner* — Monica D Harrison
*Assistant Examiner* — John Lin
(74) *Attorney, Agent, or Firm* — Sughrue Mion, PLLC

(57) ABSTRACT

A semiconductor device includes a first circuit 1 and a second circuit 2 that are connected in series, a first terminal T1 that applies a first potential to a first power supply line DL1 of the first circuit 1, a second terminal T2 that applies a second potential to a second power supply line DL2 of the second circuit 2, a third terminal T3 that is connected to a signal transfer line of the first circuit 1, and a protection circuit that is connected to the third terminal T3, and discharges a current from the third terminal T3 to a fourth terminal T4 when a potential of the third terminal T3 becomes higher than a first threshold value. The first power supply line DL1 and the second power supply line DL2 are separated, and the fourth terminal T4 is not directly connected to the first power supply line DL1 and is electrically connected to a lead.

5 Claims, 9 Drawing Sheets

(51) Int. Cl.
| | |
|---|---|
| *H01L 21/822* | (2006.01) |
| *H01L 27/04* | (2006.01) |
| *H01L 23/31* | (2006.01) |
| *H01L 23/498* | (2006.01) |
| *H01L 23/552* | (2006.01) |
| *H01L 27/02* | (2006.01) |
| *H05F 3/00* | (2006.01) |

(52) U.S. Cl.
CPC .... *H01L 23/4952* (2013.01); *H01L 23/49503* (2013.01); *H01L 23/49541* (2013.01); *H01L 23/49568* (2013.01); *H01L 23/49575* (2013.01); *H01L 23/49861* (2013.01); *H01L 23/552* (2013.01); *H01L 27/0292* (2013.01); *H01L 27/04* (2013.01); *H01L 2224/48091* (2013.01); *H01L 2224/48247* (2013.01); *H01L 2224/48257* (2013.01); *H01L 2224/49113* (2013.01); *H01L 2924/181* (2013.01); *H05F 3/00* (2013.01)

(56) References Cited

U.S. PATENT DOCUMENTS

| | | | | |
|---|---|---|---|---|
| 6,040,968 | A * | 3/2000 | Duvvury | H01L 27/0248 |
| | | | | 361/56 |
| 2005/0184759 | A1* | 8/2005 | Tsukada | H03K 19/0013 |
| | | | | 326/83 |
| 2009/0303645 | A1* | 12/2009 | Sasaki | H01L 23/60 |
| | | | | 361/56 |

FOREIGN PATENT DOCUMENTS

| | | | |
|---|---|---|---|
| JP | 60-14460 | A | 1/1985 |
| JP | 4-61371 | A | 2/1992 |
| JP | 4-111350 | A | 4/1992 |
| JP | 2001-298157 | A | 10/2001 |
| JP | 2002-110919 | A | 4/2002 |
| JP | 2003-309179 | A | 10/2003 |
| JP | 2004-119883 | A | 4/2004 |
| JP | 2004-282058 | A | 10/2004 |
| JP | 2006-114711 | A | 4/2006 |
| JP | 4978998 | B2 | 7/2012 |
| WO | 2005/088701 | A1 | 9/2005 |

OTHER PUBLICATIONS

International Search Report dated Jul. 7, 2015, issued by the International Searching Authority in application No. PCT/JP2015/067055.

International Preliminary Report on Patentability with translation of Written Opinion dated Dec. 29, 2016, issued by the International Searching Authority in application No. PCT/JP2015/067055.

Communication dated Feb. 12, 2018 from the State Intellectual Property Office of the P.R.C. in counterpart Chinese application No. 201580030527.1.

* cited by examiner

SEMICONDUCTOR DEVICE

CROSS REFERENCE TO RELATED APPLICATIONS

This application is a National Stage of International Application No. PCT/JP2015/067055, filed Jun. 12, 2015, claiming priority based on Japanese Patent Application No. 2014-127418, filed Jun. 20, 2014, the contents of all of which are incorporated herein by reference in their entirety.

TECHNICAL FIELD

The present invention relates to a semiconductor device with improved resistance to ESD noise.

BACKGROUND ART

In a semiconductor device which operates in an environment in which "electrostatic discharge" (ESD) occurs, it is preferable for an influence of ESD noise to be reduced. This is because element destruction or a malfunction occurs when ESD noise or the like is input to an analog circuit or the like. Therefore, several schemes have been conventionally proposed (see, for example, Patent Literature 1).

CITATION LIST

Patent Literature

Patent Literature 1: Japanese Patent No. 4978998

SUMMARY OF INVENTION

Technical Problem

However, in a case where a first circuit and a second circuit having different functions are connected in series, inventive ideas for reducing an influence of ESD noise or the like are not known.

The present invention has been made in view of such problems, and an object thereof is to provide a semiconductor device capable of reducing an influence of ESD noise or the like.

Solution to Problem

In order to solve the above-described problems, a first semiconductor device is a semiconductor device including a plurality of leads, the semiconductor device including: a first circuit and a second circuit that are connected in series; a first terminal that applies a first potential to a first power supply line of the first circuit; a second terminal that applies a second potential to a second power supply line of the second circuit; a third terminal that is connected to a signal transfer line of the first circuit; and a first protection circuit that is connected to the third terminal, and discharges a current from the third terminal to a fourth terminal when a potential of the third terminal becomes higher than a first threshold value, wherein the first power supply line and the second power supply line are separated, and the fourth terminal is not directly connected to the first power supply line and is electrically connected to a lead.

Since the first power supply line of the first circuit and the second power supply line of the second circuit are separated from each other, an influence of a fluctuation in a potential of one of the power supply lines on the other is originally small, and a stable circuit operation is performed. On the other hand, when ESD noise or the like is generated and a potential of the third terminal greatly rises, a current flows from the first protection circuit to the fourth terminal. Thus, the first circuit is protected. However, when the fourth terminal is directly connected to the first power supply line, a power supply potential of the first power supply line fluctuates, the first circuit malfunctions, and a malfunction occurs in transmission and reception between the first circuit and the second circuit. Therefore, in this semiconductor device, the fourth terminal is not directly connected to the first power supply line and is connected to the lead. Accordingly; ESD noise output from the fourth terminal at the time of the operation of the first protection circuit does not directly flow into the first circuit via the first power supply line. Thus, a malfunction of the first circuit or a malfunction of transmission and reception between the first circuit and the second circuit are suppressed.

Further, a second semiconductor device includes a first lead connected to the first terminal via a first wiring; a fourth wiring connected to the fourth terminal; and a first shield wiring located between the first wiring and the fourth wiring.

Since the first wiring is connected to the first power supply line, the potential of the first power supply line fluctuates if ESD noise is superimposed on the first wiring, and if the fourth wiring is adjacent to the first wiring, noise is easily superimposed on the first wiring. This is because a large noise current flows from the first protection circuit to the fourth wiring when ESD noise is input. In such a case, since the first shield wiring is disposed between the first wiring and the fourth. wiring, it is possible to block electromagnetic waves traveling through a space from the fourth wiring to the first wiring. Therefore, it is possible to suppress a fluctuation in the potential of the first power supply line.

The above-described circuit configuration can be applied not only to the power supply line but also to a fixed line to which a fixed potential is applied, such as a ground line. If the circuit configuration is applied to both, it is possible to perform the above-described suppression of the malfunction more effectively.

That is, a third semiconductor device includes a fifth terminal that applies a first fixed potential to a first fixed line of the first circuit; a sixth terminal that applies a second fixed potential to a second fixed line of the second circuit; and a second protection circuit that is coupled to the third terminal and flows a current from the seventh terminal to the third terminal when a potential of the third terminal becomes lower than a second threshold value, wherein the first fixed line and the second fixed line are separated, and the seventh terminal is electrically connected to a lead without going through the first fixed line.

Since the first fixed line of the first circuit and the second fixed line of the second circuit are separated from each other, an influence of a fluctuation in a potential in one of the fixed lines on the other is originally small, and a stable circuit operation is performed. On the other hand, when ESD noise or the like is generated and the potential of the third terminal greatly drops, a current flows from the second protection circuit to the seventh terminal. Thus, the first circuit is protected. However, when the seventh terminal is directly connected to the first fixed line, the potential of the first fixed line fluctuates, the first circuit malfunctions, and a malfunction occurs in transmission and reception between the first circuit and the second circuit. Therefore, in this semiconductor device, the seventh terminal is not directly connected to the first fixed line and is connected to the lead. Accordingly, ESD noise output from the seventh terminal at the time of the operation of the second protection circuit does not directly flow into the first circuit via the first fixed line. Thus, a malfunction of the first circuit or a malfunction of transmission and reception between the first circuit and the second circuit are suppressed.

A fourth semiconductor device includes a fifth lead connected to the fifth terminal via a fifth wiring; a seventh wiring connected to the seventh terminal; and a second shield wiring located between the fifth wiring and the seventh wiring.

Since the fifth wiring is connected to the first fixed line, if ESD noise is superimposed on the fifth wiring, a potential of the first fixed line fluctuates, and if the seventh wiring is adjacent to the fifth wiring, noise is easily superimposed on the seventh wiring. This is because a large noise current flows from the second protection circuit to the seventh wiring when the ESD noise is input. In such a case, if the second shield wiring is arranged between the fifth wiring and the seventh wiring, it is possible to block electromagnetic waves traveling through a space from the seventh wiring to the fifth wiring and to suppress a fluctuation in the potential of the first fixed line.

Further, a fifth semiconductor device further includes a third protection circuit including a pair of diodes connected in parallel with reversed polarities, wherein the third protection circuit is interposed between the first power supply line and the fourth terminal.

Further, a sixth semiconductor device further includes a fourth protection circuit including a pair of diodes connected in parallel with reversed polarities, wherein the fourth protection circuit is interposed between the first fixed line and the seventh terminal.

The third protection circuit and/or the fourth protection circuit can consume an output current of the protection circuit when ESD noise is input to the third terminal at the time of manufacture of the semiconductor device. Therefore, ESD noise does not flow in the first circuit, and the first circuit is protected.

According to the semiconductor device of the present invention, it is possible to reduce the influence of ESD noise or the like.

DESCRIPTION OF EMBODIMENTS

Figure 1:
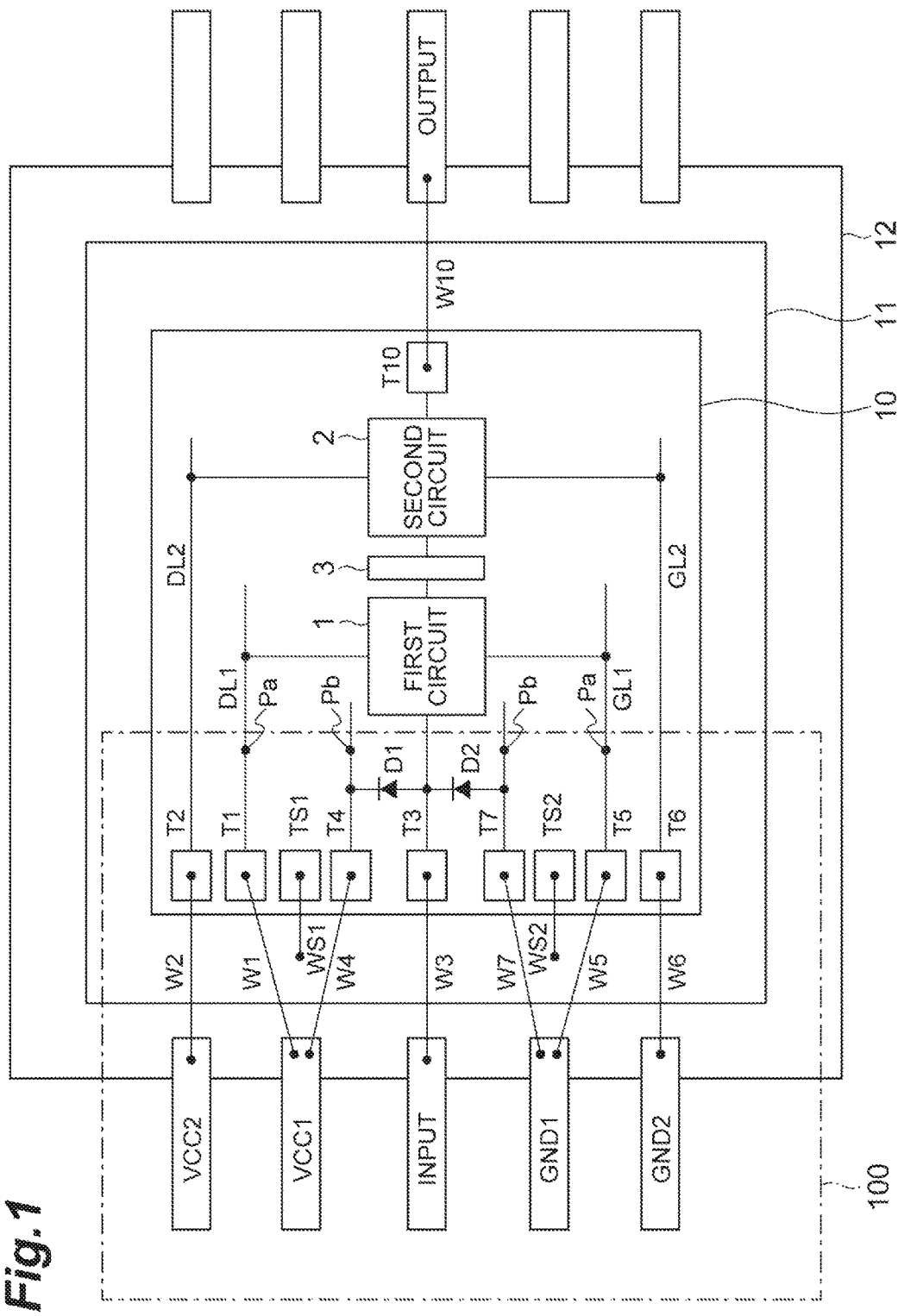
FIG. 1 is a plan view of a semiconductor device.

Hereinafter, a semiconductor device according to an embodiment will be described. The same reference numerals are used for the same elements and repeated description will be omitted.

FIG. 1 is a plan view of a semiconductor device.

This semiconductor device includes a semiconductor chip 10, a die pad 11 to which the semiconductor chip 10 is fixed, a plurality of leads (ten in FIG. 1) arranged to be spaced around the die pad 11, and a package 12 in which the die pad 11 and the leads are molded. In FIG. 1, a resin mold located on the lead is excluded so that an internal connection relationship is seen.

Figure 2:
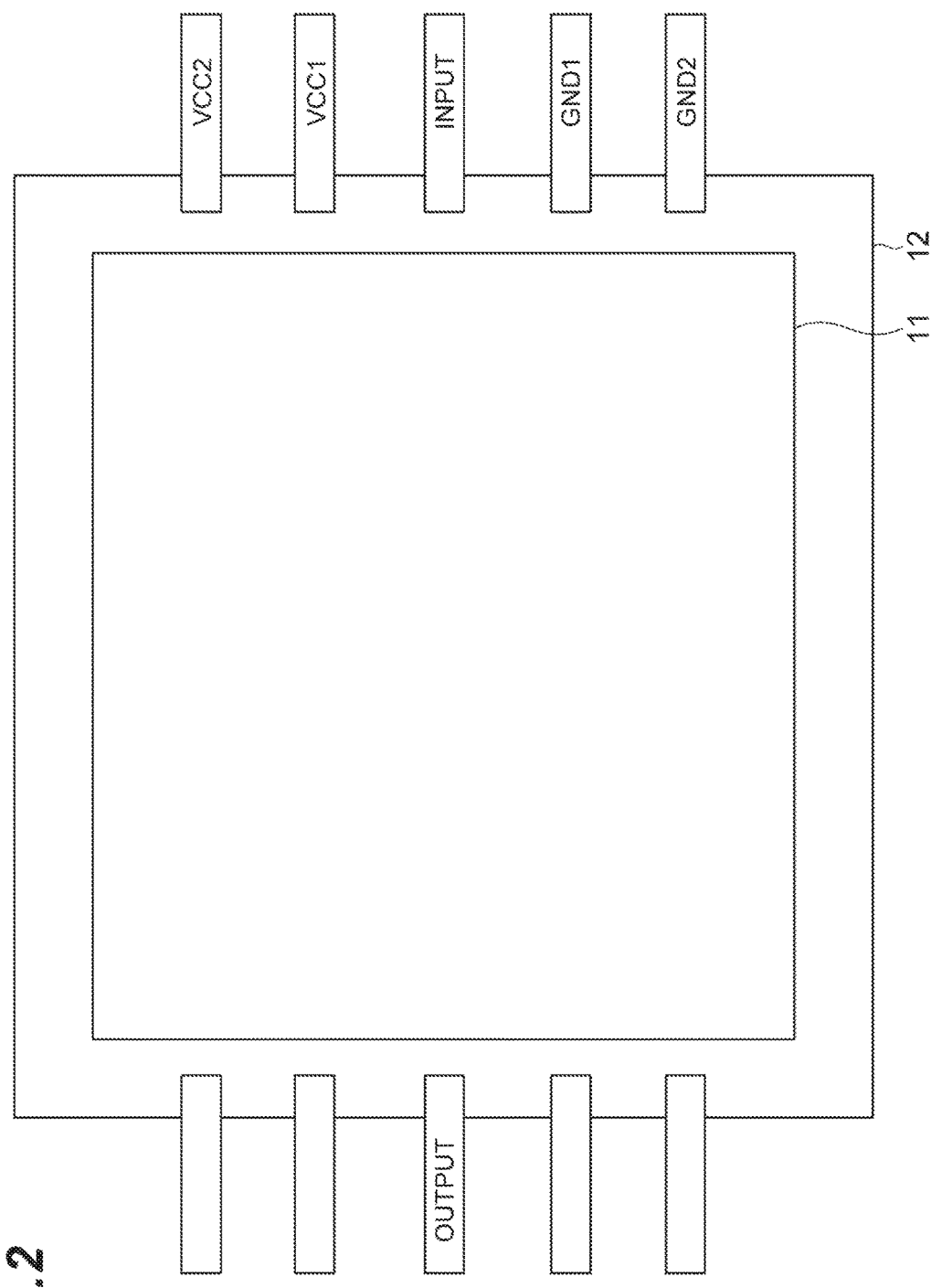
FIG. 2 is a bottom view of the semiconductor device.

FIG. 2 is a bottom view of the semiconductor device. Since a back surface of the rectangular die pad 11 and a back surface of each lead are exposed in a back surface of the package 12, radiation of heat can be performed through the die pad 11 and the leads.

Figure 3:
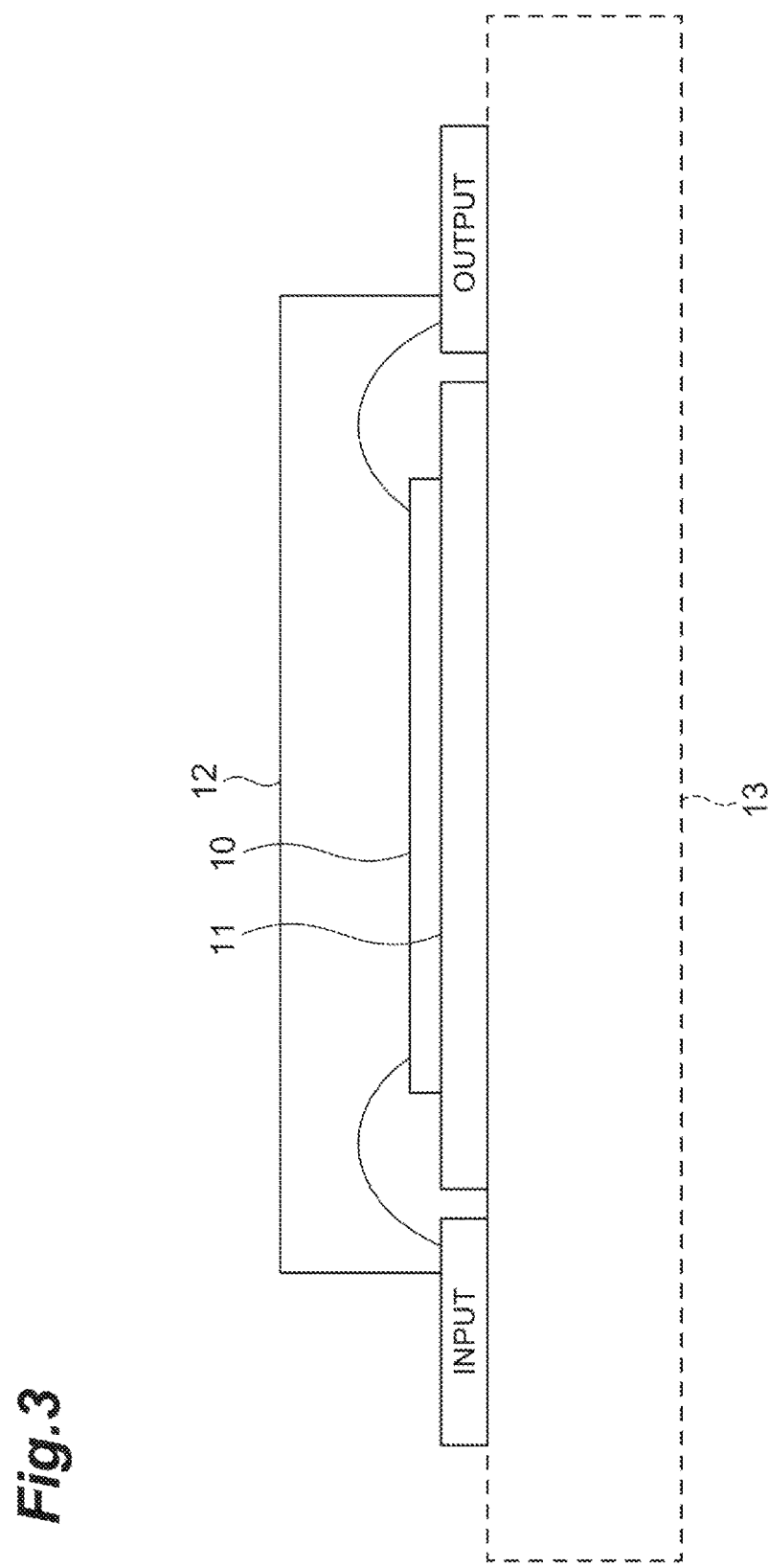
FIG. 3 is a diagram illustrating a cross-sectional configuration of a semiconductor device.

FIG. 3 is a diagram illustrating a cross-sectional configuration of the semiconductor device. A semiconductor device body including the semiconductor chip 10, the die pad 11, the package 12, and the leads is fixed on a wiring circuit hoard 13. The wiring circuit board 13 may be a multilayer wiring board. The semiconductor chip 10 and the various leads (an input lead INPUT and an output lead OUTPUT are illustrated in FIG. 3) are connected via a bonding wire (wiring). The semiconductor chip 10 is embedded inside the resin package 12.

Referring back to FIG. 1, a circuit configuration will be described.

This semiconductor device includes a plurality of leads, and various terminals are formed using electrode pads formed on a surface of the semiconductor chip 10. A first circuit 1 and a second circuit 2 connected in series are formed in the semiconductor chip 10, and a buffer circuit 3 is formed between the first circuit 1 and the second circuit 2. A first protection circuit including a diode D1 and a second protection circuit including a diode D2 are provided on the input side of the first circuit 1 in the semiconductor chip 10. The buffer circuit 3 is intended to reduce erroneous determination of signal transfer between the first circuit 1 and the second circuit 2 even when noise is large, and a Schmitt buffer may be used.

A first terminal T1, a second terminal T2, a third terminal T3, a fourth terminal T4, a fifth terminal T5, a sixth terminal T6, a seventh terminal T7, a first shield terminal TS1, a second shield terminal TS2, and a second circuit-side terminal T10 are provided on the semiconductor chip 10.

For convenience of description, the same reference numeral as those for the leads are used for voltages or signals applied to the leads. That is, potentials VCC1, VCC2, GND1, and GND2 are assumed to be applied to the respective leads VCC1, VCC2, GND1, and GND2. Further, it is assumed that an input signal INPUT is applied to an input lead INPUT (third lead) and an output signal OUTPUT is taken out from an output lead OUTPUT.

The first terminal T1 is connected to a first power supply line DL1 of the first circuit 1 and applies the first potential (VCC1) to the first power supply line DL1, and is connected to the first lead VCC1 via the wiring W1. The second terminal T2 is connected to the second power supply line DL2 of the second circuit 2 and applies the second potential (VCC2) to the second power supply line DL2, and is connected to the second lead VCC2 via the wiring W2. The third terminal T3 is connected to a signal transfer line of the first circuit 1 and is connected to the input lead INPUT via the wiring W3. The fourth terminal T4 is connected to a cathode of the diode D1 and is connected to the lead VCC1 via the wiring W4. A resistance value of each wiring is greater than a resistance value of each lead.

The fifth terminal T5 is connected to a first fixed line GL1 of the first circuit 1 and supplies a first fixed potential (GND1: ground potential) to the first fixed line GL1, and is connected to the fifth lead GND1 via a wiring W5. The sixth terminal T6 is connected to a second fixed line GL2 of the second circuit 2 and applies a second fixed potential (GND2: ground potential) to the second fixed line GL2, and is connected to the sixth lead GND2 via a wiring W6. The seventh terminal T7 is connected to an anode of the diode D2 and is connected to the lead GND1 via a wiring W7.

The first shield terminal TS1 is connected to the die pad 11 fixed to the ground potential via a first shield wiring WS1. The second shield terminal TS2 is connected to the die pad 11 fixed to the ground potential via a second shield wiring WS2.

The terminal T10 on the side of the second circuit 2 is connected to the output lead OUTPUT via a wiring W10.

Here, if ESD noise is superimposed on the input lead INPUT, a potential at the third terminal T3 greatly changes. The first protection circuit including the diode D1 is connected to the third terminal T3, and when a potential of the third terminal T3 becomes greater than a first threshold (a threshold voltage of the diode D1+a potential of the fourth terminal T4), current is discharged from the third terminal T3 to the fourth terminal T4. On the other hand, in the second protection circuit including the diode D2, when the potential of the third terminal T3 becomes smaller than a second threshold value (a threshold of the diode D2+potential of the seventh terminal T7), a current flows into the third terminal T3 from the seventh terminal T7.

Therefore, the input side of the first circuit 1 is protected due to an operation of the first and second protection circuits.

The first power supply line DL1 and the second power supply line DL2 are separated from each other, and the fourth terminal T4 is not directly connected to the first power supply line DL1, but is electrically connected to the lead VCC1. Further, the first fixed line GL1 and the second fixed line GL2 are separated, and the seventh terminal T7 is electrically connected to the lead GND1 without going through the first fixed line GL1.

Since the first power supply line DL1 of the first circuit 1 and the second power supply line DL2 of the second circuit 2 are separated from each other, an influence of a fluctuation in a potential of one of the power supply lines on the other is originally small, and a stable circuit operation is performed. On the other hand, when ESD noise or the like is generated and a potential of the third terminal T3 greatly rises, a current flows from the protection circuit including the diode D1 to the fourth terminal T4. Thus, the first circuit 1 is protected. However, when the fourth terminal T4 is directly connected to the first power supply line DL1, a power supply potential of the first power supply line DL1 fluctuates, the first circuit 1 malfunctions, and a malfunction occurs in transmission and reception between the first circuit 1 and the second circuit 2.

Figure 7:
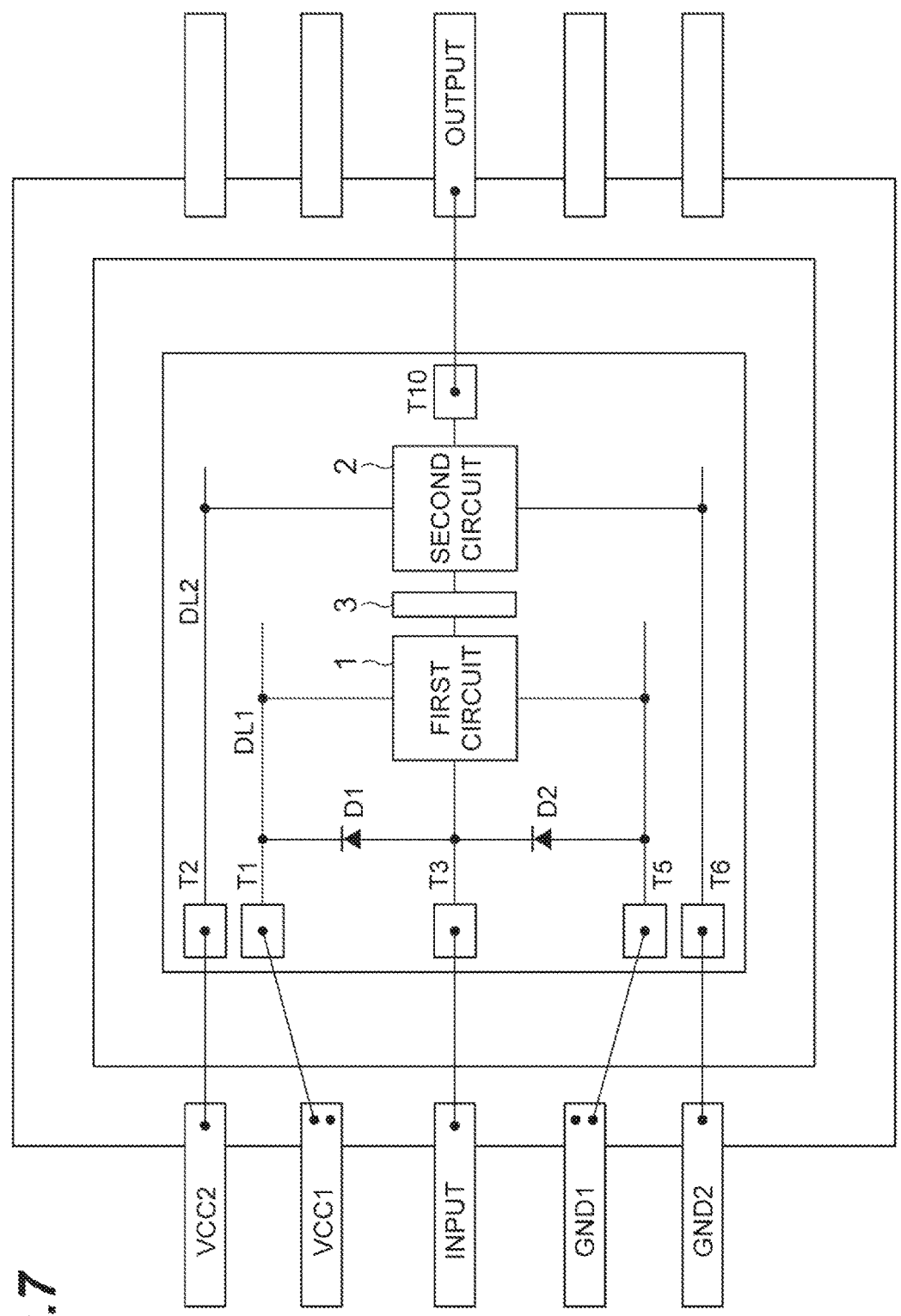
FIG. 7 is a plan view of a semiconductor device according to a comparative example.

That is, in the case of a circuit of a comparative example illustrated in FIG. 7, when ESD noise is superimposed on the third terminal T3, ESD noise output from the diode D1 causes the potential of the first power supply line DL1 to fluctuate, and malfunctions are caused in the first circuit 1.

In the semiconductor device of the embodiment in FIG. 1, the fourth terminal T4 is not directly connected to the first power supply line DL1 and is connected to the lead VCC1 without going through the first power supply line DL1. Therefore, ESD noise output from the fourth terminal T4 at the time of the operation of the protection circuit does not directly flow into the first circuit 1 via the first power supply line DL1. Thus, a malfunction of the first circuit 1 and a malfunction of transmission and reception between the first circuit 1 and the second circuit 2 are suppressed.

The first shield wiring WS1 is located between the first wiring W1 and the fourth wiring W4. Since the first wiring W1 is connected to the first power supply line DL1, the potential of the first power supply line DL1 fluctuates if the ESD noise is superimposed on the first wiring W1, and if the fourth wiring W4 is adjacent to the first wiring W1, noise is easily superimposed on the first wiring W1. This is because a large noise current flows from the first protection circuit to the fourth wiring W4 when ESD noise is input. In this example, since the first shield wiring WS1 is disposed between the first wiring W1 and the fourth wiring W4, it is possible to block electromagnetic waves traveling through a space from the fourth wiring W4 to the first wiring W1. Therefore, it is possible to suppress a fluctuation in the potential of the first power supply line DL1.

The above-described circuit configuration can be applied not only to the power supply line but also to a fixed line to which a fixed potential is applied, such as a ground line. If the circuit configuration is applied to both, it is possible to perform the above-described suppression of the malfunction more effectively.

Since the first fixed line GL1 of the first circuit 1 and the second fixed line GL2 of the second circuit 2 are separated from each other, an influence of a fluctuation in a potential in one of the fixed lines on the other is originally small, and a stable circuit operation is performed. On the other hand, when ESD noise or the like is generated and the potential of the third terminal T3 greatly drops, a current flows from the second protection circuit including the diode D2 to the seventh terminal T7. Thus, the first circuit 1 is protected. However, when the seventh terminal T7 is directly connected to the first fixed line GL1, the potential of the first fixed line GL1 fluctuates, the first circuit 1 malfunctions, and a malfunction occurs in transmission and reception between the first circuit 1 and the second circuit 2.

In the semiconductor device of this example, the seventh terminal T7 is not directly connected to the first fixed line GL1 and is connected to the lead GND1 without going through the first fixed line GL1. Therefore, since the ESD noise output from the seventh terminal T7 at the time of the operation of the second protection circuit including the diode D2 does not directly flow into the first circuit 1 via the first fixed line GL1, a malfunction of the first circuit 1 and a malfunction of transmission and reception between the first circuit 1 and the second circuit 2 are suppressed.

The second shield wiring WS2 is located between the fifth wiring W5 and the seventh wiring W7. Since the fifth wiring W5 is connected to the first fixed line GL1, if the ESD noise is superimposed on the fifth wiring W5, a potential of the first fixed line GL1 fluctuates, and if the seventh wiring W7 is adjacent to the fifth wiring W5, noise is easily superimposed on the seventh wiring W7. This is because a large noise current flows from the second protection circuit including the diode D2 to the seventh wiring W7 when the ESD noise is input. In such a case, if the second shield wiring WS2 is arranged between the fifth wiring W5 and the seventh wiring W7, it is possible to block electromagnetic waves traveling through a space from the seventh wiring W7 to the fifth wiring W5 and to suppress a fluctuation in the potential of the first fixed line GL1.

The circuit configurations of the first circuit 1 and the second circuit 2 described above are not particularly limited, and the first circuit 1 may be an analog circuit and the second circuit 2 may be a digital circuit. An example of the first circuit 1 may include an amplifier or a PLL circuit. An example of the second circuit 2 may include a digital signal processing (DSP) circuit, an encoder (in the case of a transmission circuit), a decoder (in the case of a reception circuit), a scrambler, a descrambler, a packer, an unpacker, or an error detection circuit.

Figure 4:
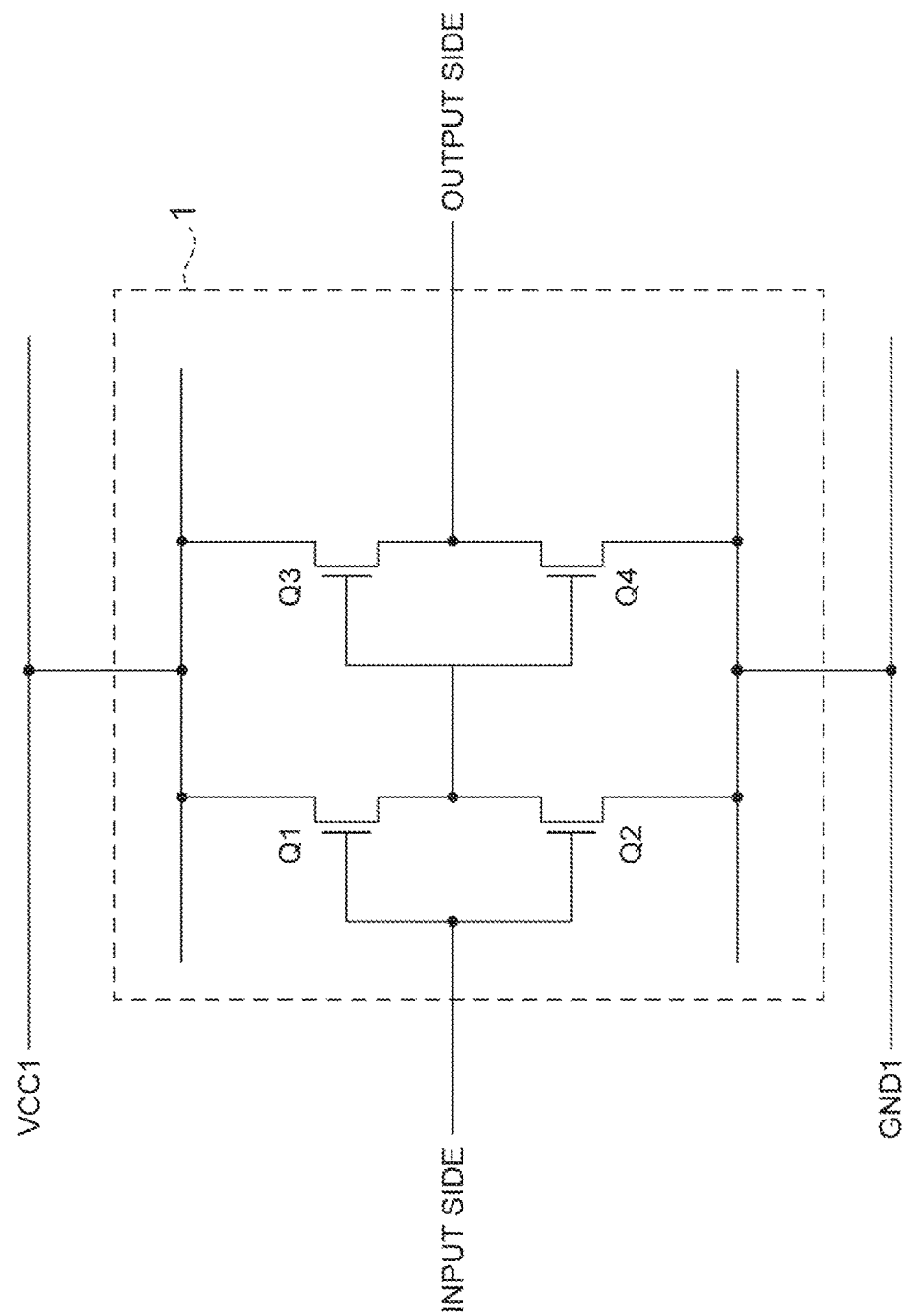
FIG. 4 is a circuit diagram illustrating an example of a first circuit.

FIG. 4 is a circuit diagram illustrating an example of the first circuit.

Transistors Q1, Q2, Q3, and Q4 are connected between the first power supply line DL1 and the first fixed line GL1, as illustrated, to function as an amplifier that transfers a signal on an input side to an output side.

Figure 5:
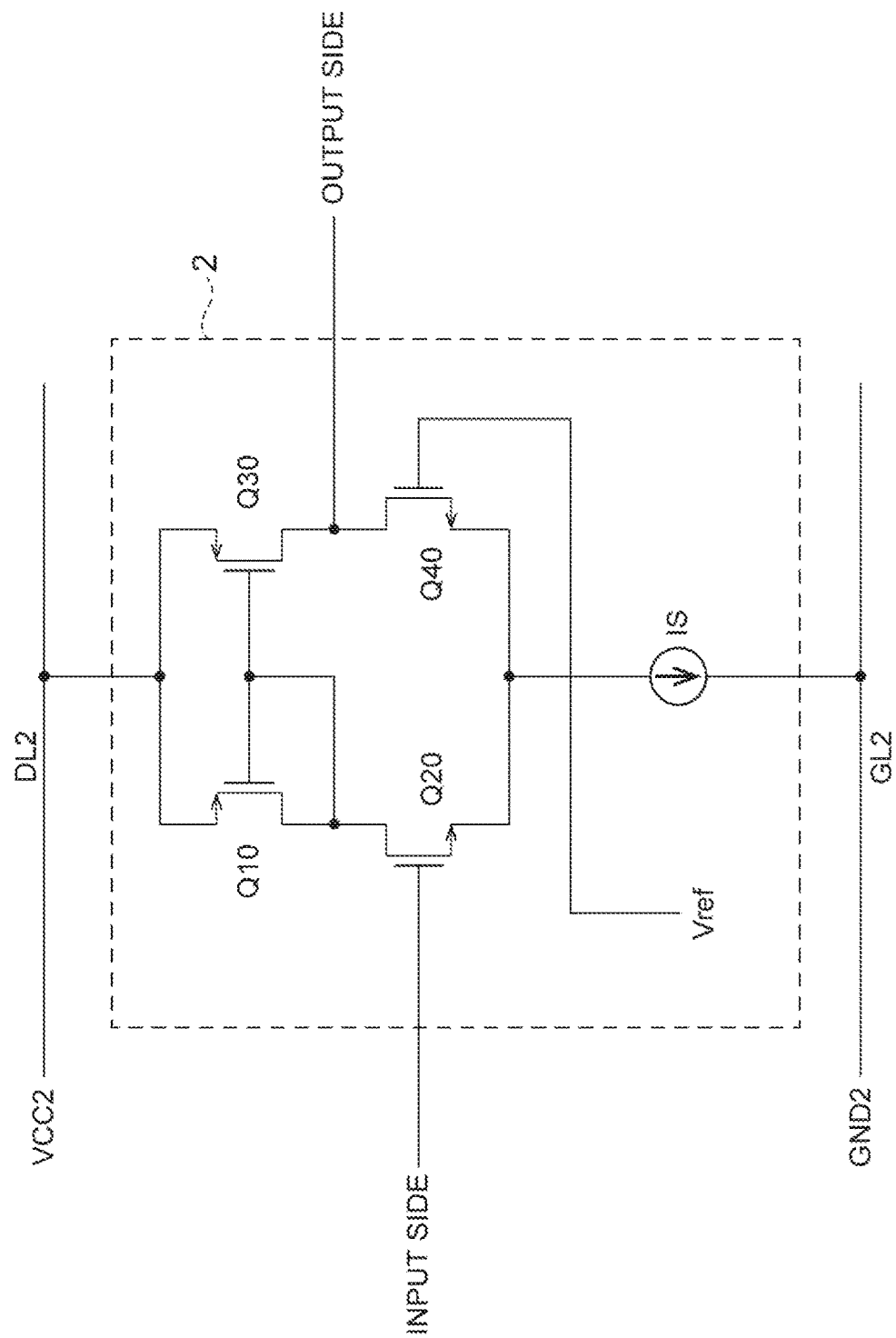
FIG. 5 is a circuit diagram illustrating an example of a second circuit.

FIG. 5 is a circuit diagram illustrating an example of the second circuit.

A current mirror circuit is connected between the second power supply line DL2 and the second fixed line GL2. That is, between the second power supply line DL2 and the second fixed line GL2, a transistor Q10 and a transistor Q20 are connected in series and, in parallel therewith, a transistor Q30 and a transistor Q40 are connected in series. Gates of a pair of transistors Q10 and Q30 on the upstream side are connected in common, and are connected to an upstream position of the transistor Q20 on the downstream side. An input signal is input to a gate of the transistor Q20, and a reference voltage Vref is input to a gate of the transistor Q40. A node on the downstream side of the transistor Q20 and the transistor Q40 is connected to the second fixed line GL2 via a current source IS. According to a potential input to the gate of the transistor Q20, a potential of a node (a connection point between the transistor Q30 and the transistor Q40) on the output side fluctuates. This potential is output as an output signal to the outside.

Figure 6:
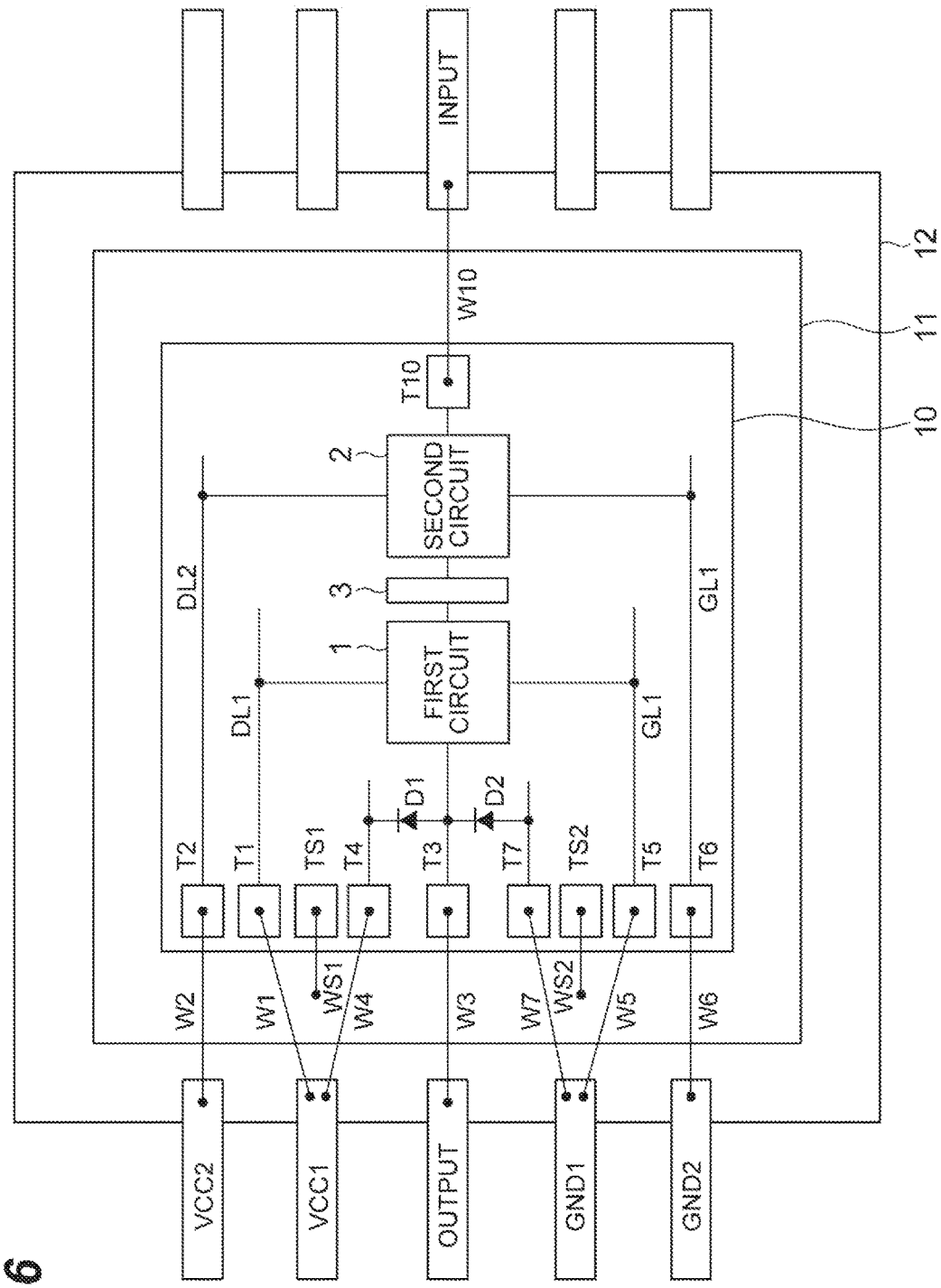
FIG. 6 is a plan view of a semiconductor device.

FIG. 6 is a plan view of a semiconductor device.

The semiconductor device has a structure in which positions of the input lead INPUT and the output lead OUTPUT illustrated in FIG. 1 are mutually exchanged. In this case, a signal is input from the input lead INPUT, and a signal processed by the second circuit 2 is input to the first circuit 1. For example, the second circuit 2 is a digital circuit, and the first circuit 1 is an analog circuit. When ESD noise is input to the third terminal T3 via the output lead OUTPUT, the semiconductor device functions similarly to the above-described circuit.

Figure 8:
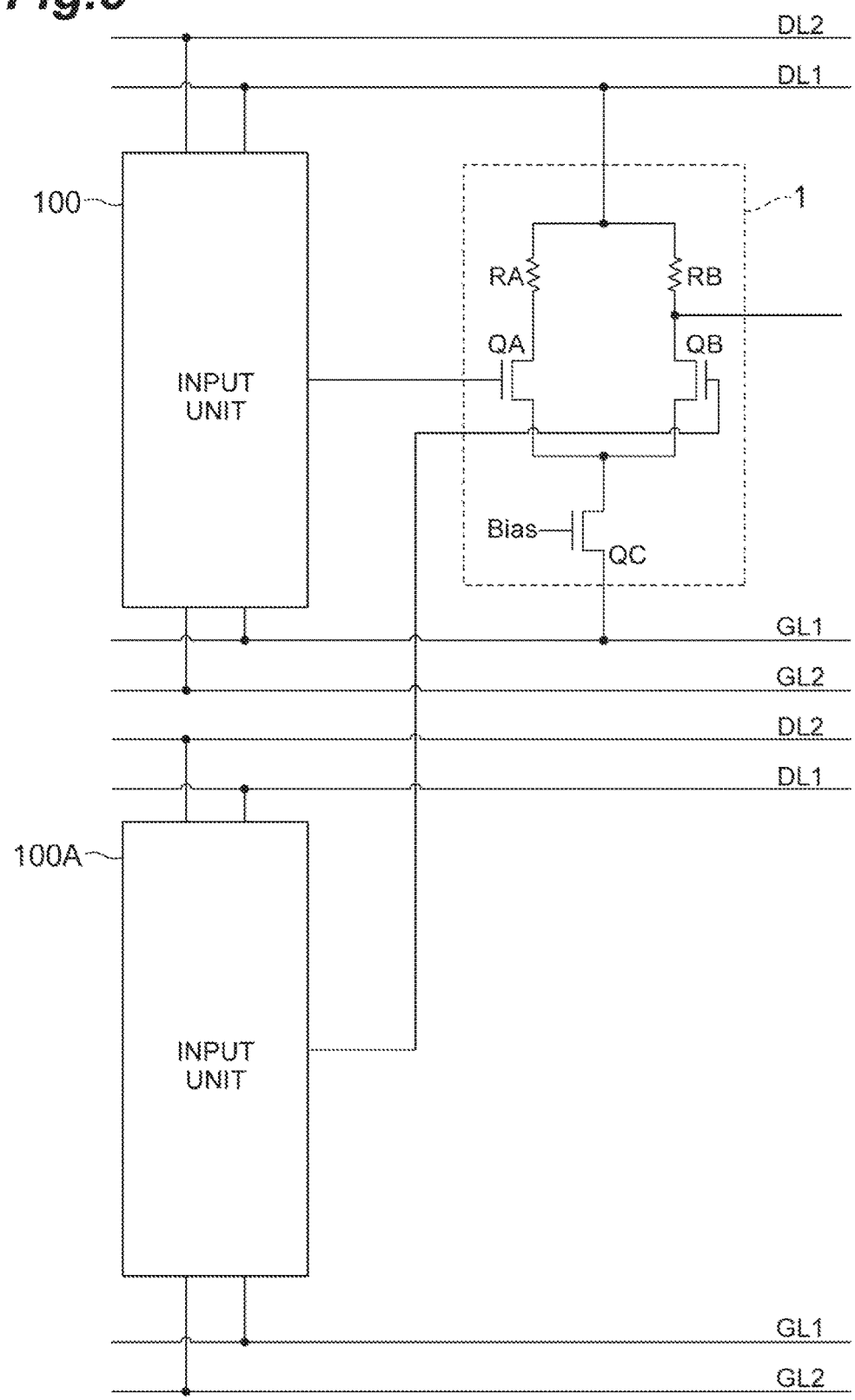
FIG. 8 is a diagram illustrating an input-side configuration of the semiconductor device in a case where a differential input is input.

FIG. 8 is a diagram illustrating a configuration of the input side of the semiconductor device when a differential input is received.

An input to the first circuit 1 described above may be a differential input. That is, two input units denoted by reference numeral 100 in FIG. 1 are included. Structures of the input unit 100 and the input unit 100A in FIG. 8 are the same. Complementary signals are input to input terminals of the input units 100 and 100A, and output signals from the input units 100 and 100A are input to the first circuit 1 via the third terminal T3 in FIG. 1. In this case, the first circuit 1 has a modified structure as follows. That is, the first circuit 1 includes a pair of transistors QA and QB, and complementary input signals from the respective input units 100 and 100A are input to gates of the respective transistors QA and QB. One-side terminals of the respective transistors QA and QB are connected to the first power supply line DL1 via resistors RA and RB, and the other-side terminals thereof are connected to the first fixed line GL1 via a switching transistor QC. An appropriate bias potential Bias can be applied to a gate of the transistor QC, and a current flows through the transistors QA and QB according to the voltage applied to the gates and the bias potential Bias. A node between the transistor QB and the resistor R2 is connected to the second circuit 2 in the subsequent stage. In this structure, since a structure of the input unit for the transistors QA and QB is the same as that of the above-described circuit, the same effect as in the above embodiment is achieved and the input unit is protected.

Figure 9:
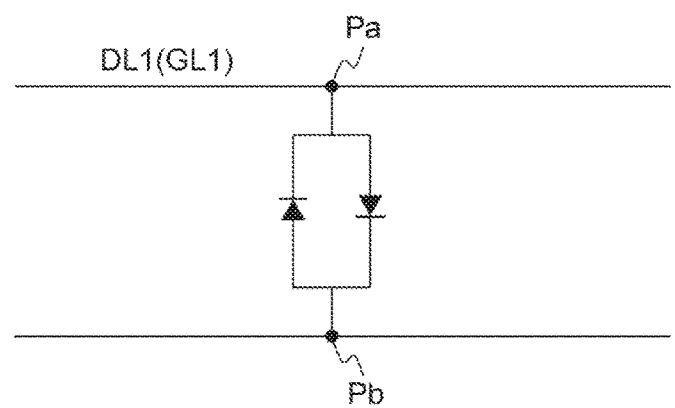
FIG. 9 is a circuit diagram of a second (or third) protection circuit.

FIG. 9 is a circuit diagram of the second (or third) protection circuit.

A protection circuit illustrated in FIG. 9 may be further provided between a node Pa of the first power supply line DL1 or the first fixed line GL1 illustrated in FIG. 1 and a node Pb on the first or second protection circuit side.

That is, in the third protection circuit, a pair of diodes D10 and D20 are connected in parallel with reversed polarities, and the third protection circuit is interposed between the first power supply line DL1 and the fourth terminal T4.

In a fourth protection circuit, a pair of diodes D10 and D20 are connected in parallel with reversed polarities, and the fourth protection circuit is interposed between the first fixed line GL1 and the seventh terminal T7. Any one of the third protection circuit and the fourth protection circuit may be provided or both may be provided. Further, as the diodes D10 and D20, a bidirectional diode may be formed using a Zener diode. In the third protection circuit or the fourth protection circuit, a plurality of diodes may be connected in series in multiple stages to form a first diode group, diodes with opposite polarity may be connected in series in multiple stages to form a second diode group, and the diode groups may be connected in parallel.

According to the above-described configuration, the third protection circuit and/or the fourth protection circuit can consume an output current of the protection circuit when ESD noise is input to the third terminal at the time of manufacture of the semiconductor device. Therefore, ESD noise does not flow in the first circuit, and the first circuit is protected.

Specifically, in assembly of the device, in a step before the protection circuit (diodes D1 and D2) is bonded and connected to the leads VCC1 and GND1 via the wirings W4 and W7, which is a step before the first circuit 1 is bonded and connected to the leads VCC1 and GND1 via the wirings W1 and W5, there is no current path that connects the protection circuit (diodes D1 and D2) and the first circuit 1 via the first power supply line DL1 or the first fixed line GL1. In this case, if ESD is input to the third terminal T3, which is an input terminal, the potential of the input terminal rises and the input unit of the protection circuit (diodes D1 and D2) may be destroyed since no current flows through the seventh terminal T7 on the ground side or the fourth terminal on the power supply side. To suppress such destruction, the bidirectional diodes D10 and D20 as described above are provided between the node Pa and the node Pb on the power supply side and the ground side.

REFERENCE SIGNS LIST

1: First circuit
2: Second circuit
DL1: First power supply line
DL2: Second power supply line
GL1: First fixed line
GL2: Second fixed line

What is claimed is:
1. A semiconductor device comprising:
a first lead for a first power supply;
a second lead for a second power supply;
a first circuit and a second circuit that are connected in series;
a third lead for input;

a first terminal that applies a first potential to a first power supply line of the first circuit, the first terminal being connected to the first lead via a first wiring;

a second terminal that applies a second potential to a second power supply line of the second circuit, the second terminal being connected to the second lead via a second wiring;

a third terminal that is connected to a signal transfer line of the first circuit, the third terminal being connected to the third lead via a third wiring;

a fourth terminal; and a first protection circuit that is connected to the third terminal, and discharges a current from the third terminal to the fourth terminal when a potential of the third terminal becomes higher than a first threshold value, wherein the first power supply line and the second power supply line are separated, and the fourth terminal is not directly connected to the first power supply line and is electrically connected to the first lead via a fourth wiring;

wherein a first shield wiring is located between the first wiring and the fourth wiring.

2. The semiconductor device according to claim 1, comprising:

a fifth terminal that applies a first fixed potential to a first fixed line of the first circuit;

a sixth terminal that applies a second fixed potential to a second fixed line of the second circuit; and a second protection circuit that is coupled to the third terminal and flows a current from a seventh terminal to the third terminal when a potential of the third terminal becomes lower than a second threshold value, wherein the first fixed line and the second fixed line are separated, and the seventh terminal is electrically connected to a fourth lead without going through the first fixed line.

3. The semiconductor device according to claim 2, comprising:

a fifth wiring;

the fourth lead connected to the fifth terminal via the fifth wiring;

a sixth wiring;

a fifth lead connected the sixth terminal via the sixth wiring;

a seventh wiring connecting the seventh terminal and the fourth lead; and a second shield wiring located between the fifth wiring and the seventh wiring.

4. The semiconductor device according to claim 2, further comprising:

a fourth protection circuit including a pair of diodes connected in parallel with reversed polarities, wherein the fourth protection circuit is interposed between the first fixed line and the seventh terminal.

5. The semiconductor device according to claim 1, further comprising:

a third protection circuit including a pair of diodes connected in parallel with reversed polarities, wherein the third protection circuit is interposed between the first power supply line and the fourth terminal.

* * * * *